United States Patent
Kishi et al.

(10) Patent No.: US 9,410,997 B2
(45) Date of Patent: Aug. 9, 2016

(54) CRYSTAL UNIT AND METHOD OF MEASURING CHARACTERISTICS OF THE CRYSTAL UNIT

(71) Applicant: FUJITSU LIMITED, Kawasaki-shi, Kanagawa (JP)

(72) Inventors: Masakazu Kishi, Kawasaki (JP); Masaru Itoh, Kawasaki (JP); Masayuki Itoh, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/734,175

(22) Filed: Jun. 9, 2015

(65) Prior Publication Data
US 2016/0003877 A1    Jan. 7, 2016

(30) Foreign Application Priority Data

Jul. 4, 2014    (JP) .................................. 2014-138722

(51) Int. Cl.
*H03B 5/32* (2006.01)
*G01R 23/02* (2006.01)
*H01Q 1/22* (2006.01)
*H03B 5/06* (2006.01)
*H03B 5/36* (2006.01)
*H01Q 9/42* (2006.01)
*G06K 19/073* (2006.01)

(52) U.S. Cl.
CPC .................. *G01R 23/02* (2013.01); *H01Q 1/22* (2013.01); *H01Q 9/42* (2013.01); *H03B 5/06* (2013.01); *H03B 5/32* (2013.01); *H03B 5/362* (2013.01); *G06K 19/073* (2013.01)

(58) Field of Classification Search
CPC ........... G01R 31/00; H01Q 1/22; H01Q 9/42; H03B 5/32; H03B 5/06; G06K 19/073
USPC ............ 73/718; 331/158, 116 R, 116 FE, 66, 331/36 C; 343/700 MS
See application file for complete search history.

(56) References Cited

U.S. PATENT DOCUMENTS

2014/0191767 A1*    7/2014    Zhou ...................... G01R 31/04
                                                                    324/538

FOREIGN PATENT DOCUMENTS

JP         01-186003 A         7/1989
JP         2009-092544 A      4/2009

* cited by examiner

*Primary Examiner* — Arnold Kinkead
(74) *Attorney, Agent, or Firm* — Squire Patton Boggs (US) LLP

(57) ABSTRACT

A crystal unit may include a crystal piece, an excitation electrode configured to excite the crystal piece, a case configured to accommodate the crystal piece, an external electrode formed in the case and configured to be electrically connected to the excitation electrode, and an antenna formed in the case and configured to be electrically connected to the external electrode.

7 Claims, 7 Drawing Sheets

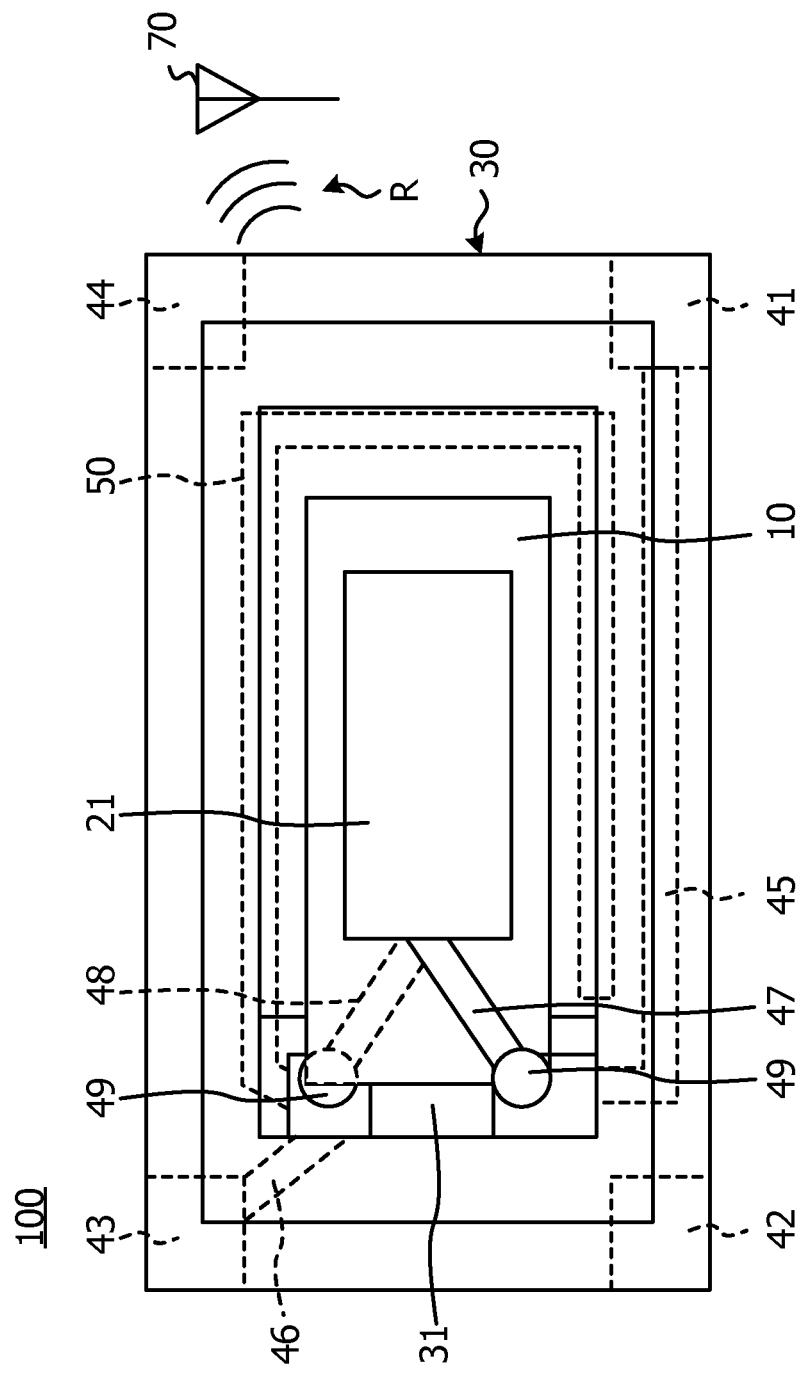

US 9,410,997 B2

CRYSTAL UNIT AND METHOD OF MEASURING CHARACTERISTICS OF THE CRYSTAL UNIT

CROSS-REFERENCE TO RELATED APPLICATION

This application is based upon and claims the benefit of priority of the prior Japanese Patent Application No. 2014-138722 filed on Jul. 4, 2014, the entire contents of which are incorporated herein by reference.

FIELD

The embodiments discussed herein are related to a crystal unit and a method of measuring the characteristics of the crystal unit.

BACKGROUND

There has been known a technique in which, in a centrifugal acceleration test system of an oscillation unit using a crystal unit, an electromagnetic wave is broadcast at an oscillation frequency of the oscillation unit from a transmitting antenna formed in the oscillation unit and is received to measure the oscillation frequency. In the centrifugal acceleration test system, the oscillation unit includes an oscillation stage (oscillation circuit) having a crystal unit, an interference amplification stage having a buffer amplifier, a transmission amplification stage having a power amplifier, and a transmitting antenna. The transmitting antenna is formed outside the oscillation stage having the crystal unit.

However, in the above-described configuration, since the transmission antenna is formed outside the crystal unit, the oscillation unit needs to include components other than the crystal unit, which may result in an increase in the size of the oscillation unit.

The following is a reference document.
[Document 1] Japanese Laid-open Patent Publication No. 2009-092544.

SUMMARY

According to an aspect of the invention, a crystal unit includes: a crystal piece; an excitation electrode configured to excite the crystal piece; a case configured to accommodate the crystal piece; an external electrode formed in the case and configured to be electrically connected to the excitation electrode; and an antenna formed in the case and configured to be electrically connected to the external electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a schematic view illustrating a reception state of electromagnetic wave by a receiving antenna 70 from an antenna 50;

DESCRIPTION OF EMBODIMENTS

Hereinafter, embodiments will be described in detail with reference to the accompanying drawings.

Figure 1A:
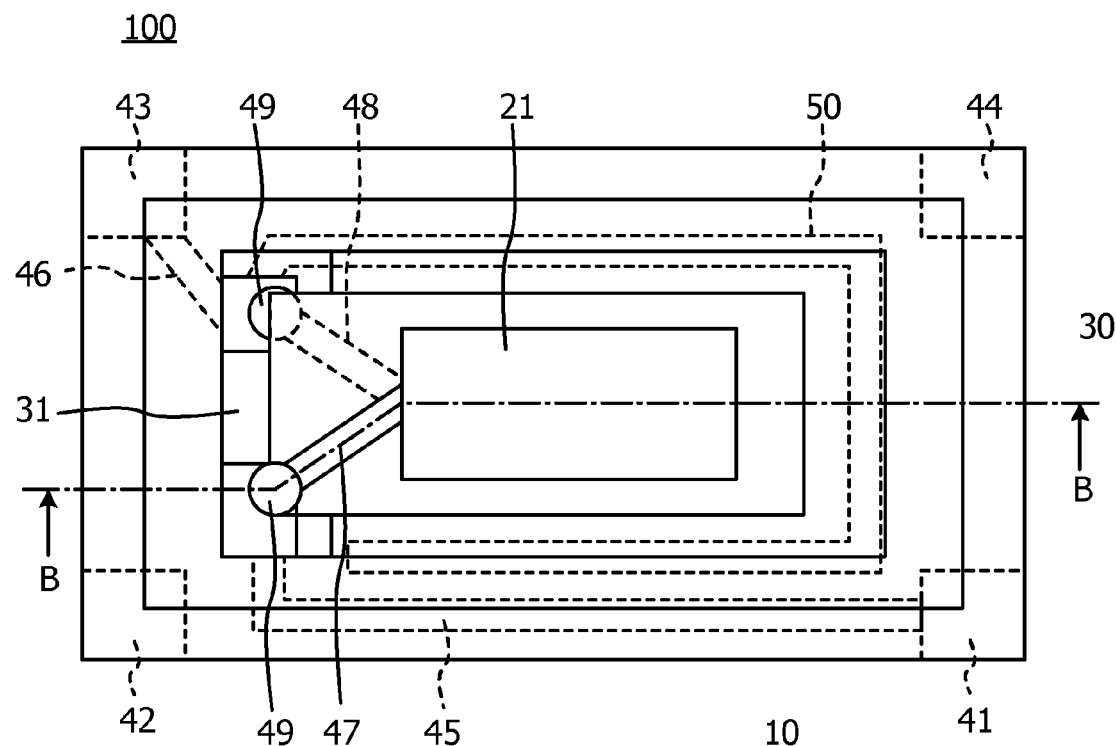
FIGS. 1A and 1B are schematic views illustrating a crystal unit 100 according to one example (Embodiment 1)
Figure 1B:
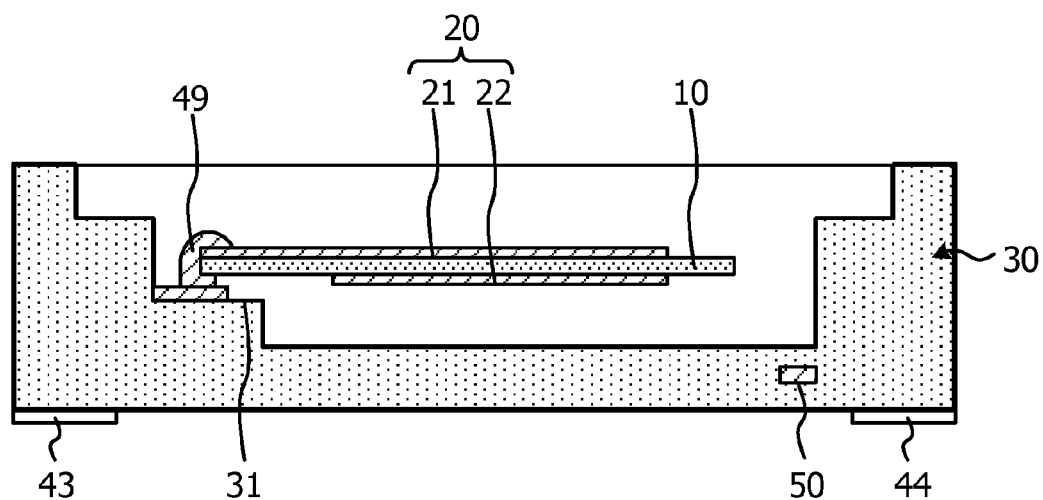

FIGS. 1A and 1B are schematic views illustrating a crystal unit 100 according to one example (Embodiment 1), FIG. 1A being a top view and FIG. 1B being a sectional view taken along the line B-B in FIG. 1A. In FIG. 1A, a cover of a case 30 is not illustrated to allow the interior of the crystal unit 100 to be viewed. In the following description, for the convenience of description, it is assumed that a thickness direction of a crystal piece 10 (a vertical direction in FIG. 1B) is a vertical direction and a side in which the cover of the case 300 is present is an "upper side." However, a direction of a mounted state of the crystal unit 100 is optional. In addition, as used herein, the term an "outer surface" refers to a surface exposed to the outside of the case 30 and the term an "inner surface" refers to a surface exposed to the inner space of the case 30.

The crystal unit 100 includes a crystal piece 10, an excitation electrode 20, a case 30, external electrodes 41 to 44 and an antenna 50. The crystal unit 100 is of a surface mounting type as illustrated in FIGS. 1A and 1B.

The crystal piece 10 may be, for example, an AT cut synthetic crystal substrate. The crystal piece 10 may be supported in a cantilever structure to the case 30. In the example illustrated in FIGS. 1A and 1B, the crystal piece 10 is supported in the cantilever structure on a dam portion 31 of the case 30.

The excitation electrode 20 excites the crystal piece 10. The excitation electrode 10 includes an upper excitation electrode formed on the upper surface of the crystal piece 10 and a lower excitation electrode 22 formed on the lower surface of the crystal piece 10. The excitation electrode 20 excites the crystal piece 10 using a potential difference between the upper excitation electrode 21 and the lower excitation electrode 22. The excitation electrode 20 may be made of gold, silver, or aluminum.

The case 30 accommodates the crystal piece 10. The case 30 is made of, for example, ceramic material. The case 30 includes a cover 34 (see, e.g., FIG. 2) and air-tightly seals the crystal piece 10 in its internal space. For example, the internal space of the case 30 is vacuous or filled with dry nitrogen and is sealed with the cover 34. The cover 34 may be a metal plate or a ceramic plate.

The external electrodes 41 to 44 are formed in the case 30. In the example illustrated in FIGS. 1A and 1B, the external electrodes 41 to 44 are formed on the outer surface of the bottom of the case 30. The external electrodes 41 and 43 are electrically connected to the upper excitation electrode 21 and the lower excitation electrode 22, respectively. In the example illustrated in FIGS. 1A and 1B, the external electrode 41 is electrically connected to the upper excitation electrode 21 via a conductor pattern 45 formed on an inner layer of the case 30 and a conductor pattern 47 formed on the upper surface of the crystal piece 10. The conductor pattern 45 has both ends exposed from the inner layer to the surface of the case 30, with one end electrically connected to the external electrode 41 and the other end electrically connected to the conductor pattern 47 by a conductive adhesive 49.

Similarly, the external electrode 43 is electrically connected to the lower excitation electrode 22 via a conductor pattern 46 formed on the inner layer of the case 30 and a conductor pattern 48 formed on the lower surface of the crystal piece 10. The conductor pattern 46 has both ends exposed from the inner layer to the surface of the case 30, with one end electrically connected to the external electrode 43 and the other end electrically connected to the conductor pattern 48 by the conductive adhesive 49. The conductive adhesive 49 is formed at an edge of the crystal piece 10 (an edge of a cantilever-supported side). In the example illustrated in FIGS. 1A and 1B, the external electrodes 42 and 44 may be omitted.

The antenna 50 is formed in the case 30. In the example illustrated in FIGS. 1A and 1B, the antenna 50 is formed on the inner layer of the case 30, as in the conductor patterns 45 and 46. For example, the antenna 50 is formed by firing a conductor on a ceramic material forming the case 30. The shape of the antenna 50 is optional. In the example illustrated in FIGS. 1A and 1B, the antenna 50 extends linearly. As illustrated in FIG. 1A, the antenna 50 may have a bent portion such that its entire length becomes a predetermined length. The predetermined length may be determined depending on the oscillation frequency (designed value) of the crystal piece 10. In the example illustrated in FIGS. 1A and 1B, the antenna 50 has one end electrically connected to the conductor pattern 46 on the dam 31 and the other end which is a free end. The antenna 50 may extend in the same plane over the entire length or may extend in a partial section in a vertical direction or in an oblique and vertical direction.

In operation of the crystal unit 100, when the crystal piece 10 is oscillated at a certain frequency, an electric field (standing wave) is generated in the antenna 50 at that frequency. Accordingly, as schematically indicated by R in FIG. 2, an electromagnetic wave having a frequency corresponding to the oscillation frequency of the crystal piece 10 is radiated from the antenna 50. Accordingly, as schematically illustrated in FIG. 2, by forming a receiving antenna 70 outside the crystal unit 100 and receiving the electromagnetic wave in the receiving antenna 70, it becomes possible to measure the oscillation frequency of the crystal unit 100.

With the crystal unit 100 illustrated in FIGS. 1A and 1B, since the antenna 50 is installed in the crystal unit 100, it becomes possible to measure the oscillation frequency of the crystal unit 100 externally. Thus, for example, for the crystal unit 100 in the mounted state, it is possible to measure the oscillation frequency. As the oscillation frequency may be measured, it becomes possible to make comparison of relative characteristics with non-defective products. In addition, since the antenna 50 is installed in the case 30, it becomes possible to make the crystal unit 100 compact as compared to a case where the antenna is externally attached to the outside of the case 30.

In the example illustrated in FIGS. 1A and 1B, the antenna 50 is formed in the aspect of electrical connection to the lower excitation electrode 22. Instead, the antenna 50 may be formed in the aspect of electrical connection to the upper excitation electrode 21. Alternatively, in addition to the antenna 50, a second antenna (not illustrated) may be formed in the aspect of electrical connection to the upper excitation electrode 21.

Figure 3:
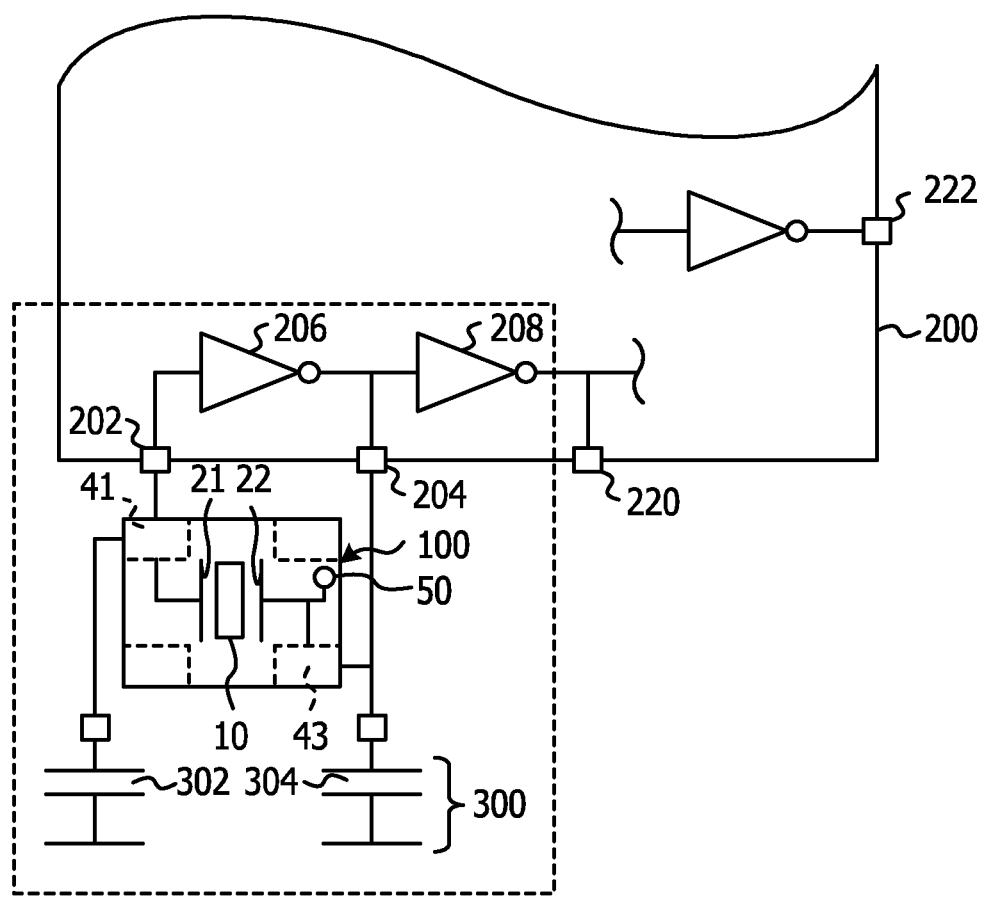
FIG. 3 is a schematic view illustrating one example of a circuit configuration incorporating the crystal unit 100.

FIG. 3 is a schematic view illustrating one example of a circuit configuration incorporating the crystal unit 100.

In the example illustrated in FIG. 3, the crystal unit 100 is connected to an IC (Integrated Circuit) 200. That is, the external electrodes 41 and 43 of the crystal unit 100 are respectively connected to an input terminal 202 and an output terminal 204 of the IC 200. The crystal unit 100 generates a clock used in the IC 200. The IC 200 includes an inverting amplifier 206 and an output buffer 208. A signal input to the input terminal 202 is inverted and amplified by the inverting amplifier 206. The inverted and amplified signal is input to the output buffer 208 and is supplied to the upper excitation electrode 21 via the external electrode 43.

Matching capacitors 300 are connected to the crystal unit 100. More specifically, a first capacitor 302 is connected between the external electrode 41 of the crystal unit 100 and a ground, and a second capacitor 304 is connected between the external electrode 43 of the crystal unit 100 and the ground. With regard to the IC 200, for example, terminal internal capacitance, stray capacitance of wiring patterns of a mounting substrate, and resistance limiting a current flown into the crystal unit 100 are not illustrated in FIG. 3. The matching capacitors 300 are formed to adjust the oscillation frequency of the crystal unit 100 such that the oscillation frequency becomes a desired value (designed value) when the total capacitance (load capacitance) including all circuit capacitance ranging from the crystal unit 100 to the IC 200 is assumed as a load. In FIG. 3, a range enclosed by a dotted line forms an oscillation circuit.

The IC 200 may include terminals 220 and 222 for monitoring the oscillation circuit. However, these terminals 220 and 222 may be omitted. This is because the oscillation frequency of the crystal unit 100 may be measured (monitored) as the crystal unit 100 includes the antenna 50, as described above. Accordingly, the crystal unit 100 illustrated in FIGS. 1A and 1B eliminates a need to form the terminals 220 and 222, thereby achieving a simplification of the IC 200.

In addition, in the input side and output side of the crystal unit 100, since the signal is amplified by the inverting amplifier 206, the output side of the crystal unit 100 has the larger amplitude of the signal than the input side thereof. Accordingly, the antenna 50 may be connected to the output side of the crystal unit 100, as illustrated in FIG. 3. In the example illustrated in FIG. 3, the upper excitation electrode 21 and the lower excitation electrode 22 may be reversed.

Figure 4:
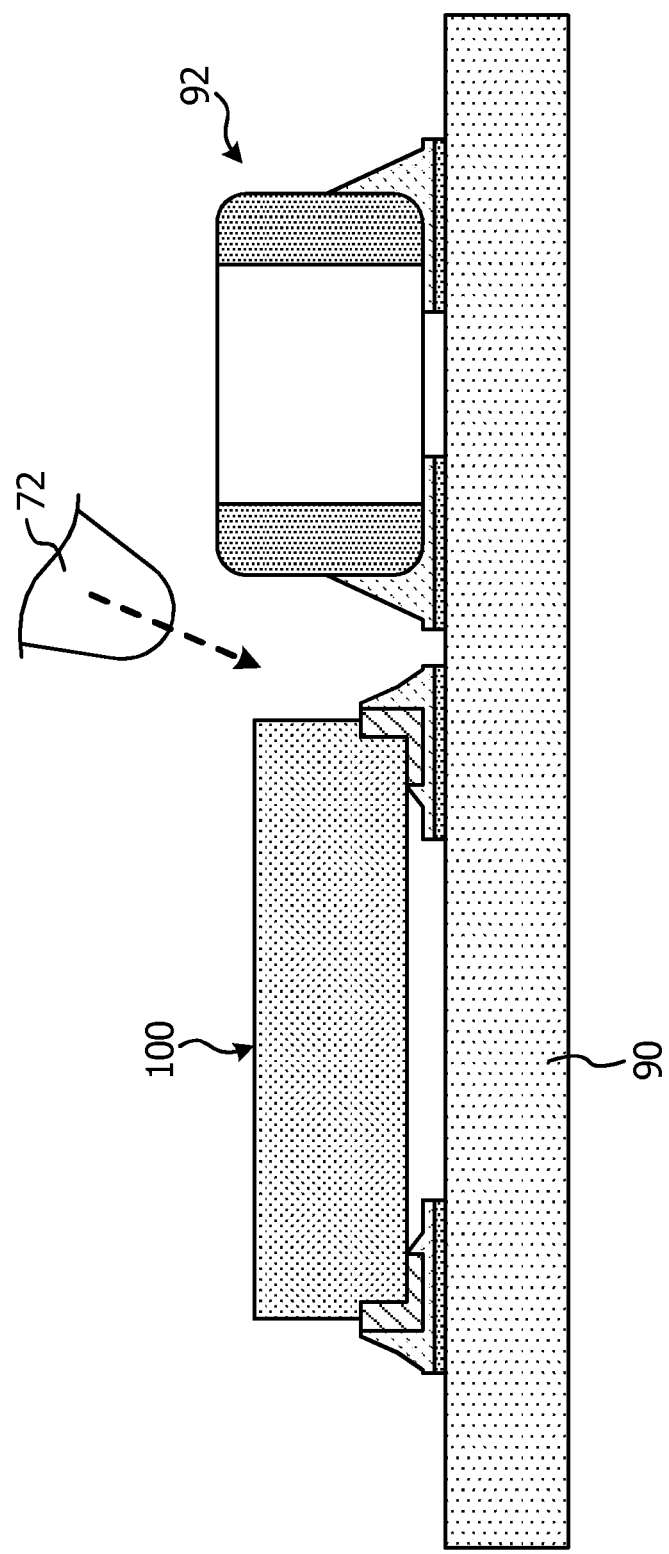
FIG. 4 is a view illustrating one example of a mounted state of the crystal unit 100.

FIG. 4 is a view illustrating one example of a mounted state of the crystal unit 100.

As illustrated in FIG. 4, the crystal unit 100 may be mounted on a substrate 90. In the example illustrated in FIG. 4, a peripheral component 92 is mounted near the crystal unit 100.

In the meantime, in recent years, compactness and high density mounting of parts and modules have been progressed to meet the demands for a device downsizing. Compactness (for example, 3.2×2.5 mm, 2.5×2.0 mm and 2.0×1.6 mm) of crystal units serving as clock sources has been also unexceptionally progressed. Under such circumstances, when the functional failure of a device is deemed to have occurred due to the abnormality of a crystal unit, it is useful to be able to measure electrical characteristics of the crystal unit with it mounted in the device. This is because taking out only the crystal unit mounted with high density for measurement is accompanied by a risk of destroying peripheral components when removing the crystal unit.

In this regard, in the mounted state of the crystal unit, it may be possible to make probe measurement of high impedance. However, with recent trend of downsizing, there may be a case where the IC 200 does not have a terminal which may verify an oscillation state (see, e.g., the terminals 220 and 222 in FIG. 3) and terminals are hidden in the back side of an IC package by BGA (Ball Grid Array). In addition, there may be a case where no probing point is present, such as, for example, the matching capacitors 300 being incorporated in the IC 200, and provision of terminals in the backside of the crystal unit 100. In addition, with the progress of a high density mounting, there may be a case where there is no site that the probe 78 contacts physically, as schematically illustrated in FIG. 4. In addition, even when a probing point is present, if the margin of the design of an oscillation circuit is insufficient, there may be a case where an oscillation state is changed (from oscillation to non-oscillation and vice versa) by only a few pF capacitance applied by the probe 78, thereby making a correct measurement impossible.

In this regard, with the crystal unit 100 illustrated in FIGS. 1A and 1B, since the crystal unit 100 includes the antenna as described above, the oscillation frequency of the crystal unit 100 may be measured with high precision even when probe measurement is impossible or difficult.

Figure 5A:
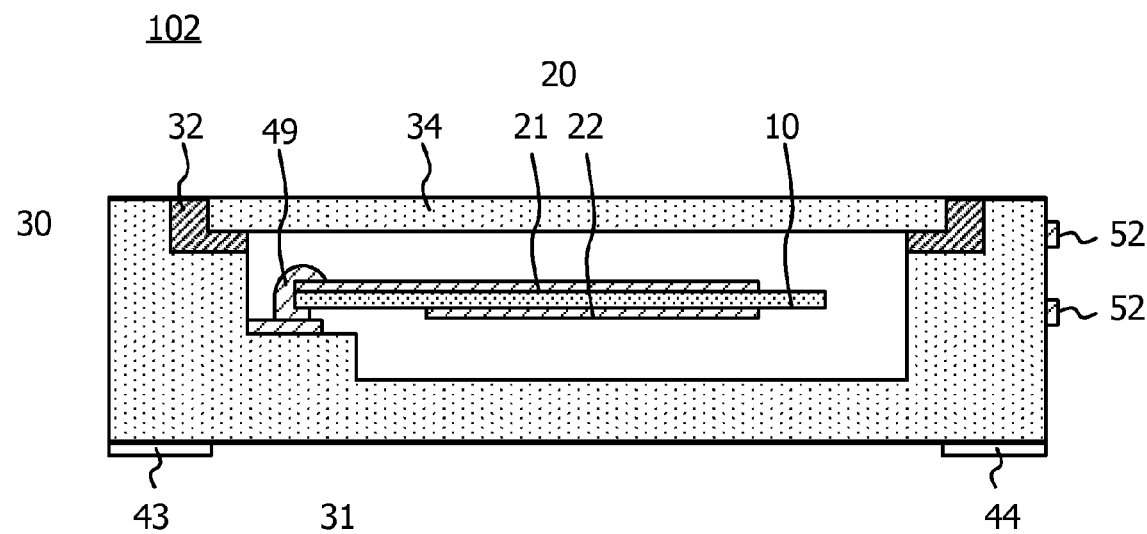
FIGS. 5A and 5B are schematic views illustrating a crystal unit 102 according to another example (Embodiment 2)
Figure 5B:
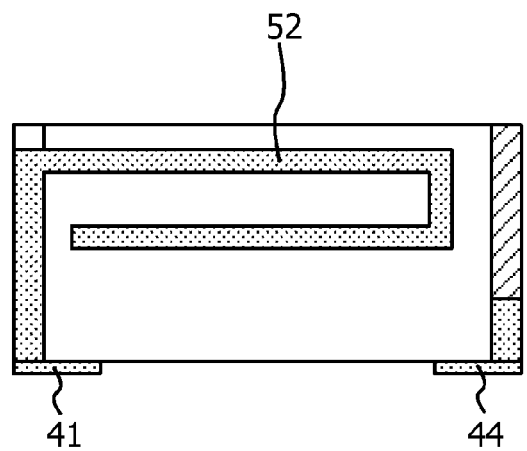

FIGS. 5A and 5B are schematic sectional views illustrating a crystal unit 102 according to one example (Embodiment 2), FIG. 5A being a sectional view and FIG. 5B being a side view when viewed in the right side of FIG. 5A.

The crystal unit 102 according to Embodiment 2 is different from the crystal unit 100 according to Embodiment 1 in that an antenna 52 is used for the antenna 50. Other configurations of Embodiment 2 may be substantially the same as the configurations of Embodiment 1.

The antenna 52 is installed on the outer surface of the case 30. The antenna 52 may be formed on one side of the case 30 or may be formed over a plurality of sides of the case 30. For example, the antenna 52 may be formed by firing a conductor on a ceramic material that forms the case 30. In the example illustrated in FIGS. 5A and 5B, the antenna 52 is formed on one side of the case 30. The shape of the antenna 52 is optional. In the example illustrated in FIGS. 5A and 5B, the antenna 52 extends linearly. As illustrated in FIG. 5B, the antenna 52 may have a bent portion such that its entire length becomes a predetermined length. The predetermined length may be determined depending on the oscillation frequency (designed value) of the crystal piece 10. In the example illustrated in FIGS. 5A and 5B, the antenna 52 has one end electrically connected to the conductor pattern 46 (or the lower excitation electrode 22) and the other end which is a free end.

The crystal unit 102 illustrated in FIGS. 5A and 5B illustrates the same effects as the crystal unit 100 illustrated in FIGS. 1A and 1B.

In the example illustrated in FIGS. 5A and 5B, the antenna 52 is installed on the outer surface of the side of the case 30. However, the antenna 52 may be installed on the outer surface of the bottom of the case 30 or may be installed on the outer surface of the cover 34. In addition, the antenna 52 needs not be installed on the outer surface of the case 30 but may be installed on the inner layer or the inner surface of the case, as in the antenna 50. In this way, the antenna 52 may be installed at any place.

In the example illustrated in FIGS. 5A and 5B, the antenna 52 is formed in the aspect of electrical connection to the lower excitation electrode 22. Instead, the antenna 52 may be formed in the aspect of electrical connection to the upper excitation electrode 21. Alternatively, in addition to the antenna 52, a second antenna (not illustrated) may be formed in the aspect of electrical connection to the upper excitation electrode 21.

Figure 6A:
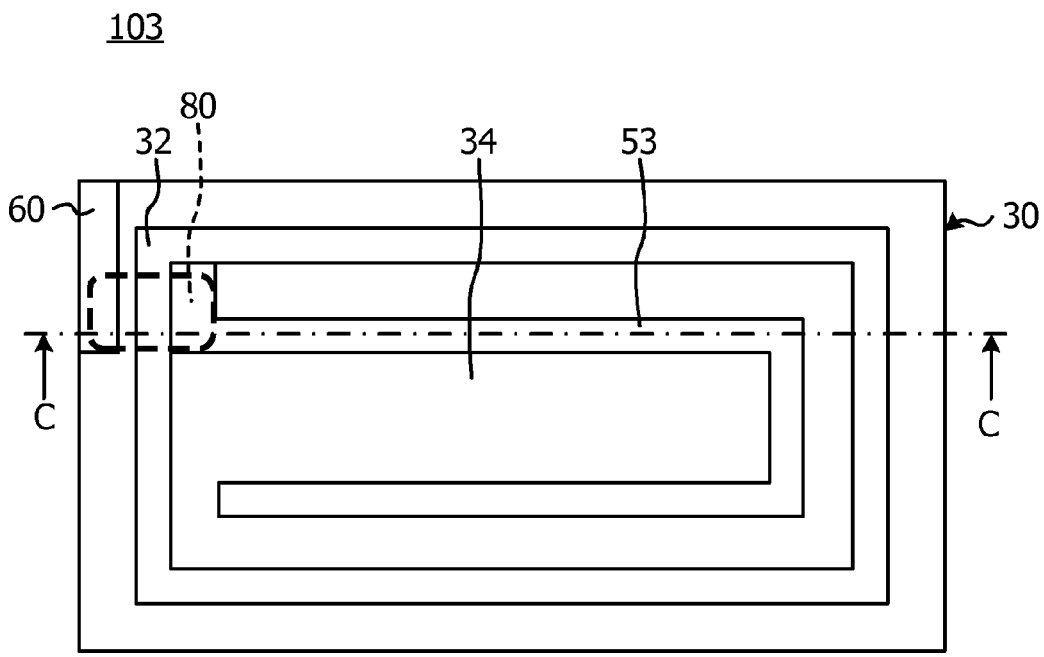
FIGS. 6A and 6B are schematic views illustrating a crystal unit 103 according to another example (Embodiment 3)
Figure 6B:
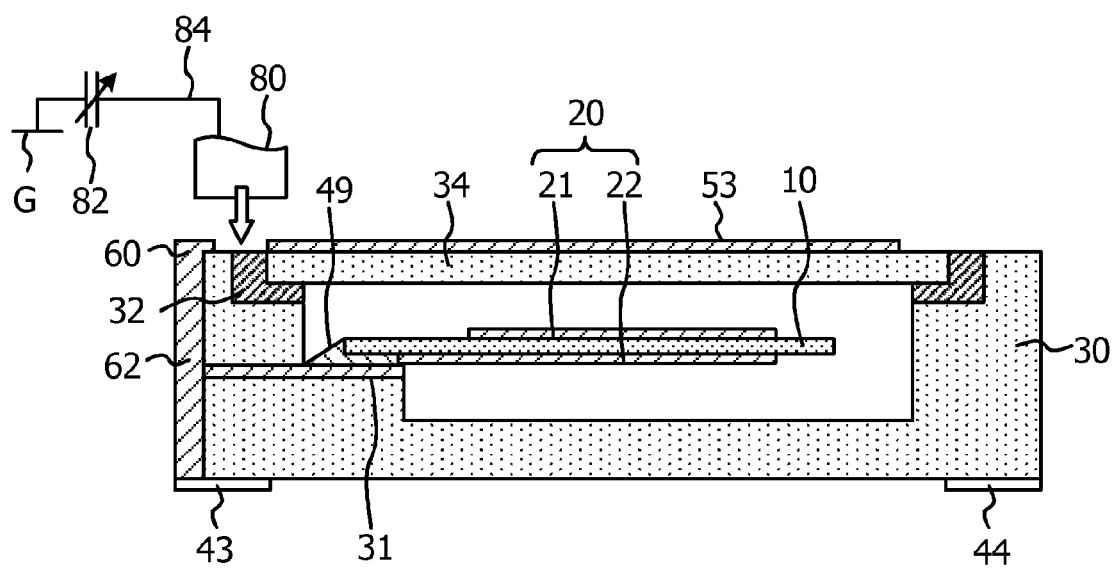
Figure 7:
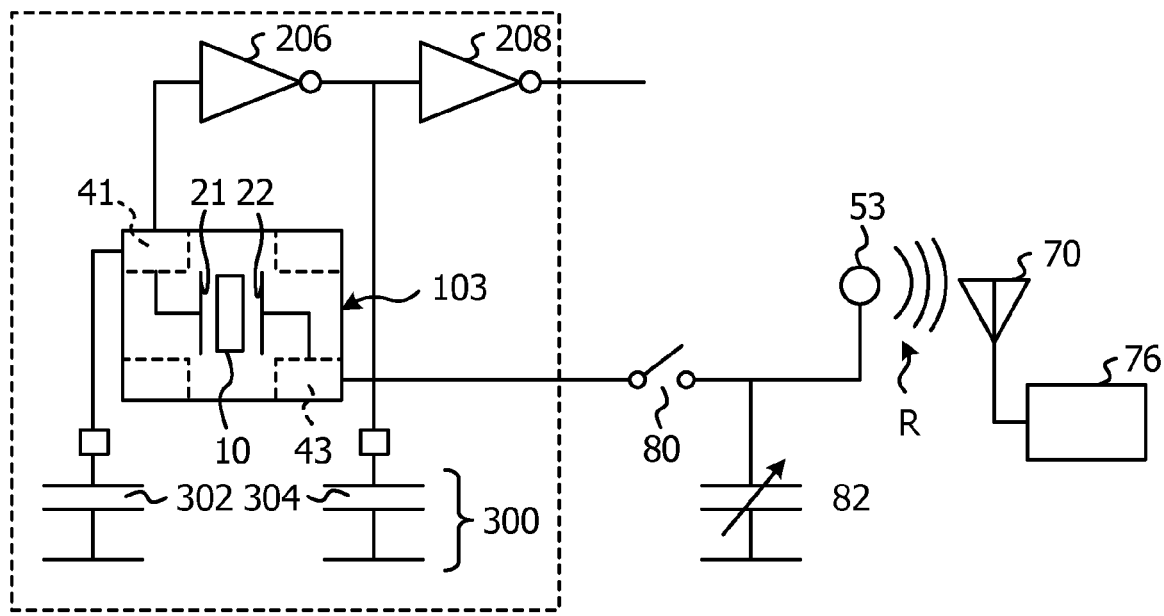
FIG. 7 is an equivalent circuit diagram of an oscillation circuit incorporating the crystal unit 103.

FIGS. 6A and 6B are schematic views illustrating a crystal unit 103 according to another example (Embodiment 3), FIG. 6A being a top view and FIG. 6B being a sectional view taken along line C-C in FIG. 6A. In FIGS. 6A and 6B, a sorter 80 and a variable capacitor 82 are schematically illustrated. In FIG. 6A, only the sorter 80 is schematically indicated by a broken line. FIG. 7 is an equivalent circuit diagram of an oscillation circuit incorporating the crystal unit 103.

The crystal unit 103 according to Embodiment 3 is different from the crystal unit 100 according to Embodiment 1 in that an antenna 53 is used for the antenna 50, and the sorter 80 and the variable capacitor 82 are formed. Other configurations of Embodiment 3 may be substantially the same as the configurations of Embodiment 1. In FIGS. 6A and 6B, substantially the same elements as those in FIGS. 1A and 1B are denoted by the same reference numerals and explanation of which will not be repeated.

The crystal unit 103 includes a crystal piece 10, an excitation electrode 20, a case 30, a seal portion (one example of an insulating portion) 32, external electrodes 41 to 44 (not partially illustrated), an antenna 53, a sorter (one example of a conductor) 80, and a variable capacitor 82.

The seal portion 32 is formed between the antenna 53 and the external electrode 43, and makes electrical isolation between the antenna 53 and the external electrode 43. In the example illustrated in FIGS. 6A and 6B, the seal portion 32 is formed on the circumference of the cover 34 in which the antenna 53 is formed. The seal portion 32 is formed to increase sealability of the cover 34 on the circumference (airtightness of the case 30). The seal portion 32 is made of, for example, insulating material such as, for example, glass. In the example illustrated in FIGS. 6A and 6B, the external electrode 43 is connected to an upper electrode 60 via a conductor pattern 62. The conductor pattern 62 is formed on the outer surface of the side of the case 30, and the upper electrode 60 is formed on the outer surface of the top of the case 30. Accordingly, in the example illustrated in FIGS. 6A and 6B, as the seal portion 32 is formed between the upper electrode 60 and the antenna 53, the seal portion 32 makes an electrical isolation between the antenna 53 and the external electrode 43.

The antenna 53 is formed on the outer surface of the cover 34. For example, the antenna 53 is formed by firing a conductor on a ceramic material that forms the cover 34. The shape of the antenna 53 is optional. In the example illustrated in FIGS. 6A and 6B, the antenna 53 extends linearly. As illustrated in FIG. 6A, the antenna 53 may have a bent portion such that its entire length becomes a predetermined length. The predetermined length may be determined depending on the oscillation frequency (designed value) of the crystal piece 10. In the example illustrated in FIGS. 6A and 6B, the antenna 53 has one end extending to the vicinity of the upper electrode 60 (but being electrically isolated from the upper electrode 60) and the other end which is a free end.

The sorter 80 may be attached to the case 30. In the example illustrated in FIGS. 6A and 6B, the sorter 80 may be attached between the antenna 53 and the upper electrode 60 in the case 30. An aspect of attachment of the shorter 80 to the case 30 is optional. For example, the sorter 80 may be attached via, for example, a fastener or may be simply mounted. The sorter 80 is formed by a conductor and its resistance may be substantially zero (0). The sorter 80 may have a shape of a jumper element (jumper chip/jumper lead). The sorter 80 electrically connects the antenna 53 and the external electrode 43 under a state where the sorter 80 is attached to the case 30. In the example illustrated in FIGS. 6A and 6B, under the state where the sorter 80 is attached to the case 30, the sorter 80 electrically connects the antenna 53 and the external electrode 43 by making a connection between the antenna 53 and the upper electrode 60. As illustrated in FIG. 7, the sorter 80 acts as a switch as a circuit and the state of attachment of the shorter 80 to the case 30 corresponds to a state where the switch is closed.

The variable capacitor 82 has one end connected between the shorter 80 and the antenna 53 and the other end connected to a ground G. That is, the variable capacitor 82 is formed in a line 84 connecting the sorter 80 to the ground G. Under the state where the sorter 80 is attached to the case 30, as illustrated in FIG. 7, the variable capacitor 82 is connected in parallel to the second capacitor 304 of the matching capacitors 300 between the antenna 53 and the external electrode 43. At this time, when the capacitance of the variable capacitor 82 is varied, the frequency of an output signal of the inverting amplifier 206 is varied, and the frequency of an electromagnetic wave transmitted from the antenna 53 is also varied.

The crystal unit 103 illustrated in FIGS. 6A and 6B illustrates the same effects as the crystal unit 103 illustrated in FIGS. 1A and 1B. In addition, with the crystal unit 103, since the electrical isolation between the antenna 53 and the external electrode 43 is made by the seal portion 32 under a state where the sorter 80 is not attached to the case 30, it is possible to reduce an effect of an external noise which may be received via the antenna 53. That is, the antenna 53 may serve as a receiving antenna, which means that the external noise received from the antenna 53 may have an effect on the operation of the crystal unit 103. In this regard, with the crystal unit 103, by attaching the sorter 80 to the case 30 only when measuring the oscillation frequency of the crystal unit 103, it is possible to eliminate the effect of the antenna 53 on the operation of the crystal unit 103 for other cases.

In the example illustrated in FIGS. 6A and 6B, the antenna 53 is formed on the outer surface of the cover 34. However, the antenna 53 may be formed on the inner layer or inner surface of the cover 34 in such a manner that the antenna 53 is exposed to the outer surface of the cover 34 in an attachment portion of the sorter 80. In addition, the antenna 53 may be installed on the outer surface of the side of the case 30 or may be install on the outer surface of the bottom of the case 30. In addition, the antenna 53 may be formed by the cover 34 itself. In addition, in the example illustrated in FIGS. 6A and 6B, although the conductor pattern 62 is formed on the outer surface of the case, it may be formed on the inner layer of the case 30.

In the example illustrated in FIGS. 6A and 6B, the antenna 53 is formed in the aspect of electrical connection to the lower excitation electrode 22. Instead, the antenna 53 may be formed in the aspect of electrical connection to the upper excitation electrode 21. Alternatively, in addition to the antenna 53, a second antenna (not illustrated) may be formed in the aspect of electrical connection to the upper excitation electrode 21.

In the example illustrated in FIGS. 6A and 6B, the variable capacitor 82 may be formed. However, the variable capacitor 82 may also be omitted as well. The meaning of the variable capacitor 82 will be described in connection with an oscillation frequency measuring method as described below.

Next, a method of measuring the oscillation frequency of the crystal unit 103 illustrated in FIGS. 6A and 6B will be described.

In measurement of the oscillation frequency, first, the sorter 80 is attached to the case 30 and the antenna 53 and the external electrode 43 are electrically connected. The crystal unit 103 enters an operation state. The receiving antenna 70 (FIG. 7) is installed and an electromagnetic wave is received from the antenna 53. A signal according to the electromagnetic wave received in the receiving antenna 70 is processed in a signal processing apparatus 76 and the oscillation frequency of the crystal unit 103 is measured. For example, the signal processing apparatus 76 outputs the peak frequency of the received signal by performing a process such as, for example, FFT (Fast Fourier Transform).

At this time, if a plurality of peak frequencies exists near a designed value of the oscillation frequency of the crystal unit 103 due to a noise effect, the capacitance of the variable capacitor 82 is changed. The capacitance of the variable capacitor 82 may be changed manually or may be changed according to a command from the signal processing apparatus 76 (a command generated by executing a program). As described above, when the capacitance of the variable capacitor 82 is changed, the frequency of the output signal of the inverting amplifier 206 is changed and the frequency of the electromagnetic wave transmitted from the antenna 53 is also changed. On the other hand, with regard to noise, even when the capacitance of the variable capacitor 82 is changed, a frequency is not remarkably changed.

This is used to select a peak whose frequency is changed, of a plurality of peaks obtained as a result of FFT when the capacitance of the variable capacitor 82 is changed, as an object to be measured. This selection may be achieved either manually (by naked eyes of an examiner) or by the signal processing apparatus 76. When the peak of the object to be measured is selected, the capacitance of the variable capacitor 82 is changed to zero (0) (or the variable capacitor 82 is removed) and a frequency according to the peak of the object to be measured is determined as the oscillation frequency of the crystal unit 103. This determination may be achieved by an examiner or the signal processing apparatus 76.

In this way, since the crystal unit 103 illustrated in FIGS. 6A and 6B includes the variable capacitor 82, even when a plurality of peak frequencies exists near the designed value of the oscillation frequency of the crystal unit 103, it is possible to measure the oscillation frequency of the crystal unit 103 with a high precision. This is particularly useful when the electromagnetic wave transmitted from the antenna 53 is weak. In other words, it is possible to measure the oscillation frequency of the crystal unit 103 with high precision without high performance of the antenna 53.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A crystal unit comprising:
   a crystal piece;
   an excitation electrode configured to excite the crystal piece;
   a case configured to accommodate the crystal piece;
   an external electrode formed in the case and configured to be electrically connected to the excitation electrode; and
   an antenna formed in the case and configured to be electrically connected to the external electrode,
   wherein the antenna is formed on an inner layer or a surface of the case.

2. The crystal unit according to claim 1, further comprising:

an insulating portion formed between the antenna and the external electrode and configured to make an electrical isolation between the antenna and the external electrode; and a conductor attachable to the case and configured to electrically connect the antenna and the external electrode in a state where the conductor is attached to the case.

3. The crystal unit according to claim 2, further comprising:

a variable capacitor having one end connected to the conductor and the other end connected to a ground.

4. The crystal unit according to claim 1, wherein the case includes a cover.

5. The crystal unit according to claim 1, wherein, when the crystal unit is connected to an IC (Integrated Circuit), the external electrode includes a first external electrode connected to an input side of an amplifier in the IC, and a second external electrode connected to an output side of the amplifier in the IC, and wherein the antenna is electrically connected to the second external electrode.

6. The crystal unit according to claim 1, wherein the crystal unit is of a surface mounting type.

7. A method of measuring characteristics of a crystal unit, comprising:

disposing a conductor on an insulating portion between an antenna and an excitation electrode which excites a crystal piece in the crystal unit;

receiving an electromagnetic wave transmitted from the antenna when the crystal piece is excited;

analyzing a frequency of the received electromagnetic wave; and changing capacitance of a variable capacitor having one end connected to the conductor and the other end connected to a ground, wherein the analyzing a frequency of the received electromagnetic wave includes determining an oscillation frequency of the crystal unit based on a peak according to a peak frequency which is changed when the capacitance of the variable capacitor is changed.

* * * * *